(12) United States Patent
Hayashi et al.

(10) Patent No.: US 10,772,251 B2
(45) Date of Patent: Sep. 8, 2020

(54) SETUP SUPPORT DEVICE

(71) Applicant: FUJI CORPORATION, Chiryu-shi (JP)

(72) Inventors: Hideki Hayashi, Okazaki (JP); Hiroyuki Haneda, Nagoya (JP); Koji Shimizu, Nukata-gun (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 16/348,921

(22) PCT Filed: Nov. 17, 2016

(86) PCT No.: PCT/JP2016/084158
§ 371 (c)(1),
(2) Date: May 10, 2019

(87) PCT Pub. No.: WO2018/092249
PCT Pub. Date: May 24, 2018

(65) Prior Publication Data
US 2019/0281737 A1    Sep. 12, 2019

(51) Int. Cl.
*H05K 13/08*    (2006.01)
*G05B 19/19*    (2006.01)
(Continued)

(52) U.S. Cl.
CPC ......... *H05K 13/0857* (2018.08); *G05B 15/02* (2013.01); *G05B 19/19* (2013.01);
(Continued)

(58) Field of Classification Search
CPC .... H05K 3/301; H05K 13/0061; H05K 13/02; H05K 13/021; H05K 13/0215;
(Continued)

(56) References Cited

U.S. PATENT DOCUMENTS 7,089,074 B2 *  8/2006  Bollinger ......... G05B 19/41875
                                                   700/117
7,181,307 B2 *  2/2007  Kodama ............ H05K 13/0882
                                                   700/121
(Continued)

FOREIGN PATENT DOCUMENTS

EP    2 424 343 A2    2/2012
JP    2016-18968 A    2/2016

*Primary Examiner* — Crystal J Barnes-Bullock
(74) *Attorney, Agent, or Firm* — Oblon, McClelland, Maier & Neustadt, L.L.P.

(57) ABSTRACT

A setup support device that improves the efficiency of setup of a component mounter by guiding supplying of feeders to a component supply device as preparation for setting of the feeders. The support setup device includes: a preparation cart on which are loaded multiple of the feeders used to perform multiple production jobs; and a feeder identifying section configured to identify multiple of the feeders to be set on a component supply device among the multiple feeders loaded on the preparation cart. The preparation cart includes a guidance section configured to issue guidance all at once for the identified multiple feeders to an operator performing the setup so as to supply the identified multiple feeders to the component supply device as preparation for setting the identified multiple feeders on the component supply device.

10 Claims, 7 Drawing Sheets

(51) Int. Cl.
*H05K 13/04* (2006.01)
*H05K 13/00* (2006.01)
*H05K 13/02* (2006.01)
*H05K 3/30* (2006.01)
*G05B 19/418* (2006.01)
*G05B 15/02* (2006.01)

(52) U.S. Cl.
CPC ....... *G05B 19/418* (2013.01); *G05B 19/4189* (2013.01); *G05B 19/41865* (2013.01); *H05K 3/301* (2013.01); *H05K 13/0061* (2013.01); *H05K 13/021* (2013.01); *H05K 13/0215* (2018.08); *H05K 13/0408* (2013.01); *H05K 13/0419* (2018.08); *H05K 13/084* (2018.08); *H05K 13/087* (2018.08); *H05K 13/0853* (2018.08); *H05K 13/0882* (2018.08); *G05B 2219/36262* (2013.01); *G05B 2219/45026* (2013.01); *G05B 2219/50386* (2013.01); *H05K 13/02* (2013.01); *H05K 2203/01* (2013.01); *Y02P 90/02* (2015.11); *Y02P 90/04* (2015.11); *Y02P 90/20* (2015.11); *Y10T 29/53174* (2015.01)

(58) Field of Classification Search
CPC ........... H05K 13/0408; H05K 13/0419; H05K 13/08; H05K 13/084; H05K 13/0853; H05K 13/0857; H05K 13/086; H05K 13/087; H05K 13/0882; H05K 2203/01; G05B 15/02; G05B 19/418; G05B 19/41865; G05B 19/4189; G05B 2219/36262; G05B 2219/45026; G05B 2219/50386; Y02P 90/02; Y02P 90/04; Y02P 90/20; Y10T 29/53174
See application file for complete search history.

(56) References Cited

U.S. PATENT DOCUMENTS

| | | | | |
|---|---|---|---|---|
| 9,310,789 | B2* | 4/2016 | Shimizu | G05B 15/02 |
| 9,480,195 | B2* | 10/2016 | Kurata | H05K 13/08 |
| 9,811,078 | B2* | 11/2017 | Sagara | G05B 19/41865 |
| 10,212,826 | B2* | 2/2019 | Yamasaki | H05K 3/301 |
| 10,394,228 | B2* | 8/2019 | Ohashi | G05B 19/41865 |
| 2016/0231727 | A1 | 8/2016 | Sagara | |
| 2018/0049353 | A1* | 2/2018 | Michizoe | H05K 13/0419 |
| 2018/0086592 | A1* | 3/2018 | Ikuta | B65H 43/08 |
| 2019/0141839 | A1* | 5/2019 | Yamasaki | H05K 13/087 |

* cited by examiner

FIG. 5

Table 1 Feeder data

| Feeder | Reel | Component type |
|---|---|---|
| Fdx10 | R-01 | Pa |
| Fdx11 | R-02 | Pb |
| Fdx12 | R-03 | Pc |
| Fdx13 | R-04 | Pd |
| : | : | : |

Table 2 Loading data

| Slot | Feeder | Reel | Component type |
|---|---|---|---|
| P-SL01 | Fdx10 | R-01 | Pa |
| P-SL02 | Fdx11 | R-02 | Pb |
| P-SL31 | Fdx12 | R-03 | Pc |
| P-SL32 | Fdx13 | R-04 | Pd |
| : | : | : | : |

Table 3 Specifying mode

| Specifying mode ||
|---|---|
| Next production mode | Group production mode |
| JobA | Gr01 { JobA – JobC } |
| | Gr02 { JobD, JobE } |

SETUP SUPPORT DEVICE

TECHNICAL FIELD

The present application relates to a setup support device.

BACKGROUND ART

A setup support device supports setup for a component mounter that produces a board product by mounting electronic components on a circuit board. A component mounter is provided with a component supply device that supplies various electronic components using multiple feeders. Setup of a component mounter requires that feeders capable of supplying component types set in advance according to an optimization processing or the like are each set in multiple slots of a component supply device.

In patent literature 1, when multiple feeders are moved from a preparation cart to the component supply device, the slot and the feeder that should be set on that slot are indicated by lights of a display device turning on. According to patent literature 1, by issuing guidance at the same time for the slot and the feeder to the operator performing the setup, setup of the component mounter can be performed efficiently.

CITATION LIST

Patent Literature

Patent literature 1: JP-A-2016-018968

BRIEF SUMMARY

Technical Problem

Because such setup of a component mounter affects the operating rate of the component mounter, it is desirable to perform the setup more efficiently and reliably. The present disclosure takes account of such circumstances, and an object thereof is to provide a setup support device that improves the efficiency of setup of a component mounter by guiding supplying of feeders to a component supply device as preparation for setting of the feeders.

Solution to Problem

A first setup support device of the present disclosure supports setup of a component mounter. The component mounter produces multiple types of board products by performing various multiple production jobs by picking up electronic components supplied by multiple feeders set on a component supply device and mounting the electronic components on circuit boards. The setup support device is provided with: a preparation cart on which are loaded multiple of the feeders used to perform the multiple production jobs; an identification device configured to acquire identification information of the component supply device; and a feeder identifying section configured to identify multiple of the feeders to be set on the component supply device among the multiple feeders loaded on the preparation cart, based on the identification information, loading information that indicates the multiple feeders loaded on the preparation cart, and a production schedule that indicates an order in which to perform the production jobs that is a production order of the multiple types of board products. The preparation cart includes a guidance section configured to issue guidance all at once for the identified multiple feeders to an operator performing the setup so as to supply the identified multiple feeders to the component supply device as preparation for setting the identified multiple feeders on the component supply device.

A first setup support device of the present disclosure supports setup of multiple component mounters that configure a production line that produces board products. The component mounters, during production of the board products, perform a production job by picking up electronic components supplied by multiple feeders set on the component supply device and mounting the electronic components on circuit boards. The setup support device includes: a preparation cart on which are loaded multiple of the feeders used to perform the multiple production jobs; an identification device configured to acquire identification information of the component supply device; and a feeder identifying section configured to identify multiple of the feeders to be set on the component supply device among the multiple feeders loaded on the preparation cart, based on the identification information, and loading information that indicates the multiple feeders loaded on the preparation cart. The preparation cart includes a guidance section configured to issue guidance all at once for the identified multiple feeders to an operator performing the setup so as to supply the identified multiple feeders to the component supply device as preparation for setting the identified multiple feeders on the component supply device.

Advantageous Effects

With a first setup support device and a second setup support device an operator can easily identify feeders 23 to supply to the component supply device among the multiple feeders loaded on the preparation cart according to the guidance. Thus, an operator can supply to component supply device 20 as preparation for setting to a slot. Further, setup is divided into a process of collectively supplying multiple feeders 23, and a process of reliably setting the multiple feeders 23. As a result, because processes are performed together efficiently, it is possible to perform setup of component mounter 1 overall efficiently and reliably.

BRIEF DESCRIPTION OF DRAWINGS

FIG. 5 shows feeder data, loading information, and job specifying information.

DESCRIPTION OF EMBODIMENTS

Embodiments of a setup support device are described below with reference to the drawings. A setup support device supports setup such that a specified production job can be performed by a component mounter. A component mounter is a device that picks up electronic components using a holding member such as a suction nozzle or a chuck device and transfers the electronic components to specific coordinates on a circuit board. Multiple component mounters are, for example, arranged in a line along a conveyance direction of a circuit board to configure a production line that produces a board product.

Embodiments

Configuration of Production Line

In a production line, multiple component mounters 1 are lined up in a conveyance direction (the left-right direction in FIG. 1) of circuit board 90. The production line includes, for example, a screen printer, a mounting inspection machine, a reflow oven, and the like. The multiple component mounters 1 are connected to host computer 60 and setup support device 70 via a network such that communication is possible.

Configuration of Component Mounter 1

Figure 1:
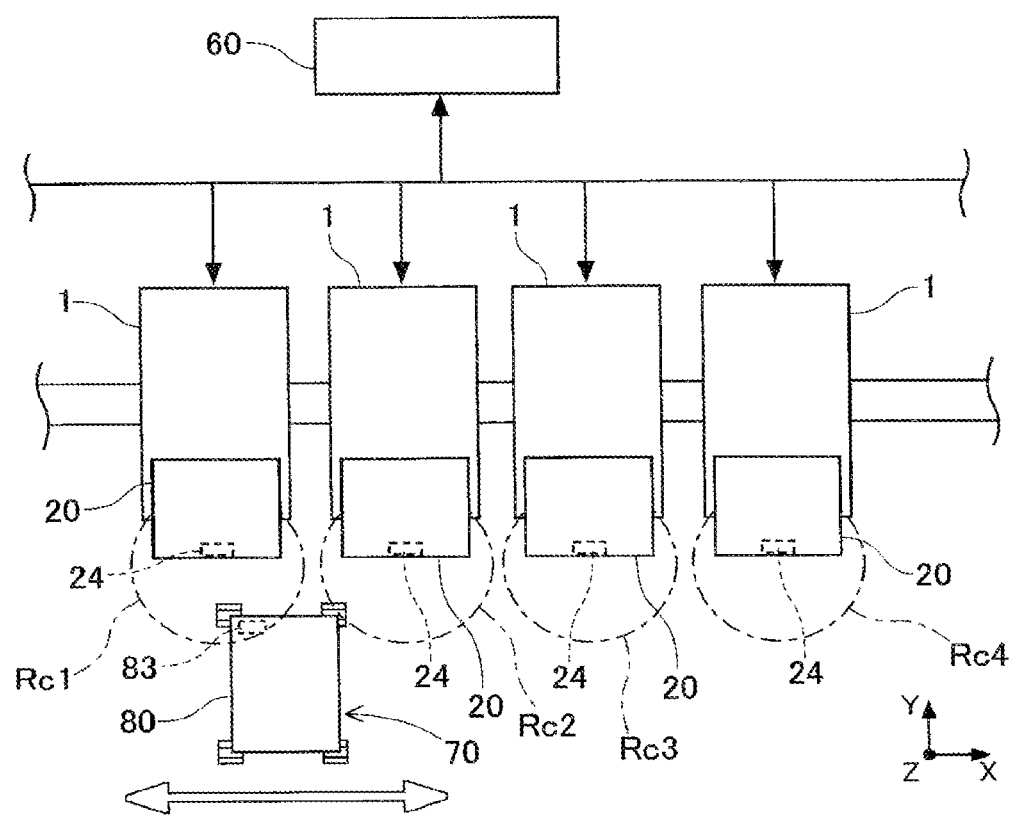
FIG. 1 is a schematic drawing showing the configuration of a production line to which a setup support device of an embodiment is applied.
Figure 2:
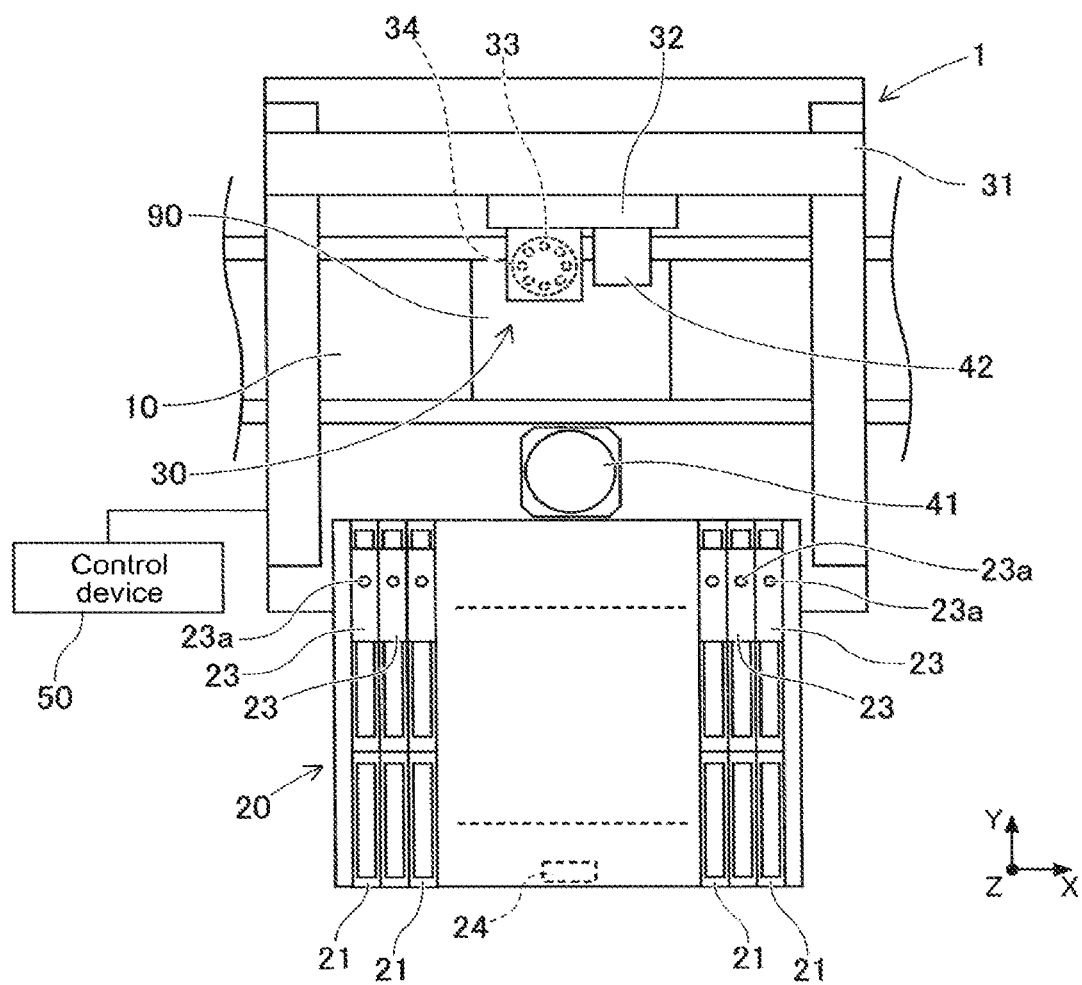
FIG. 2 is a schematic drawing showing a component mounter.

As shown in FIG. 2, component mounter 1 is provided with board conveyance device 10, component supply device 20, component transfer device 30, component camera 41, board camera 42, and control device 50. In the descriptions below, the horizontal width direction of component mounter 1 (left-right direction in FIGS. 1 and 2) is the X-axis direction, the horizontal depth direction of component mounter 1 (up-down direction in FIGS. 1 and 2) is the Y-axis direction, and the direction perpendicular to the X axis and Y axis (perpendicular to the page in FIGS. 1 and 2) is the Z-axis direction.

Board conveyance device 10 is configured from a belt conveyor or the like and consecutively conveys circuit boards 90 in a conveyance direction (in the present embodiment, the X-axis direction). Board conveyance device 10 positions circuit board 90 at a specified position inside component mounter 1. Then, after mounting processing has been performed by component mounter 1, board conveyance device 10 unloads circuit board 90 from component mounter 10.

Component supply device 20 is provided at the front side (lower side in FIG. 2) of component mounter 1. Component supply device 20 supplies electronic components to be mounted on circuit board 90. Component supply device 20 includes multiple slots 21 arranged lined up in the X-axis direction. Feeders 23 are exchangeably set in the multiple slots 21 during setup of a production job before the production job is executed. A reel around which is wound carrier tape storing many electronic components is exchangeably loaded on each feeder 23. Feeders 23 feed the carrier tape to supply electronic components to a supply position at the end of the feeder 23 such that the electronic components can be picked up.

Also, in the present embodiment, display lamp 23a is provided on a top section of feeder 23 such that an operator can see the display lamp 23a when the feeder 23 is set in a slot 21. Display lamp 23a, when feeder 23 is set in slot 21 such that power is supplied, is controlled by a control device, not shown, of feeder 23 to turn on, flash, or turn off to indicate various information to an operator.

Further, component supply device 20 is provided with an identification code. An identification symbol (ID) representing unique identification information of component supply device 20 is recorded on the identification code. A barcode, 2D code, or the like may be used as an identification code. In the present embodiment, the identification code is recorded on tag 24 that performs wireless communication with preparation cart 80, which is described later, and the identification code is sent to preparation cart 80 via wireless communication. Tag 24 is provided on the front of component supply device 20 at a specified height from the floor surface on which component mounter 1 is set.

Component transfer device 30 is configured to move in the X-axis direction and the Y-axis direction. Component transfer device 30 is provided with head driving device 31, moving body 32, and mounting head 33. Head driving device 31 is configured to move moving body 32 in the XY-axis directions using a linear motion mechanism. Mounting head 33 is used to perform the work of picking up an electronic component supplied by component supply device 20 and mounting the electronic component on circuit board 90. Mounting head 33 is fixed to moving body 32 by a clamp that is not shown.

Further, mounting head 33 includes multiple suction nozzles 34 that are detachable. Mounting head 33 supports each suction nozzle 34 so as to be rotatable around an R axis parallel to the Z axis and able to be raised and lowered. The height position and angle of each suction nozzle 34 with respect to mounting head 33 and the state of supply of negative pressure to each suction nozzle 34 is controlled. Negative pressure is supplied to suction nozzle 34 such that suction nozzle 34 can pick up an electronic component supplied by feeder 23 of component supply device 20. During setup of a production job, mounting head 33 and suction nozzle 34 described above are exchanged or loaded on a dedicated loading stand to be automatically exchanged in accordance with the production job.

Component camera 41 and board camera 42 are digital cameras with an imaging element such as a charge coupled device (CCD) or a complementary metal oxide semiconductor (CMOS). Component camera 41 and board camera 42 each perform imaging of a visual field range based on a control signal from control device 50 that is communicatively connected to component camera 41 and board camera 42, and transmit image data acquired from the imaging operation to control device 50.

Component camera 41 is fixed to the base of component mounter 1 such that the optical axis is aligned in the vertical direction (Z-axis direction). Component camera 41 is configured to image an electronic component held by suction nozzle 34 of mounting head 33 from below component transfer device 30. Board camera 42 is fixed to moving body 32 of component transfer device 30 such that the light axis faces down in a vertical direction (the Z-axis direction). Board camera 42 is configured to image circuit board 90. Further, in the present embodiment, board camera 42 is configured to be used for reading an identification code provided on suction nozzle 34 and mounting head 33 loaded on the above loading stand.

Control device 50 is configured mainly from a CPU, various types of memory, and control circuits. Control device 50 controls production jobs including mounting processing of mounting electronic components on circuit board 90. The above mounting processing is performed based on a control program, and is processing of repeatedly performing a pick and place cycle of picking up an electronic component supplied by component supply device 20 and mounting the electronic component at a specified position on circuit board 90. The product type, which is the type of the board product being produced by performing the production job, depends on the type of the production job being performed.

Further, control device 50 controls operation related to the position of mounting head 33 and the pickup and mounting mechanism. In detail, control device 50, in mounting processing, receives information outputted from various sensors provided on component mounter 1 and results of recognition processing by image processing and the like. Further, mounting control section 51 sends control signals to component transfer device 30 based on the information from the various sensors and the results of various recognition processing. Accordingly, the position and rotation angle of suction nozzle 34 attached to mounting head 33 is controlled.

Host Computer 60 and Various Data

Host computer 60 monitors the operating state of the production line and performs control of devices that configure the production line including the multiple component mounters 1. Also, host computer 60 collects information of the degree of progress or the like of production by component mounters 1. Various types of data used in controlling the multiple component mounters 1 that configure the production line are memorized on host computer 60. Further, host computer 60 generates a production schedule and setup list used to control setup support device 70, which is described later.

Figure 4:
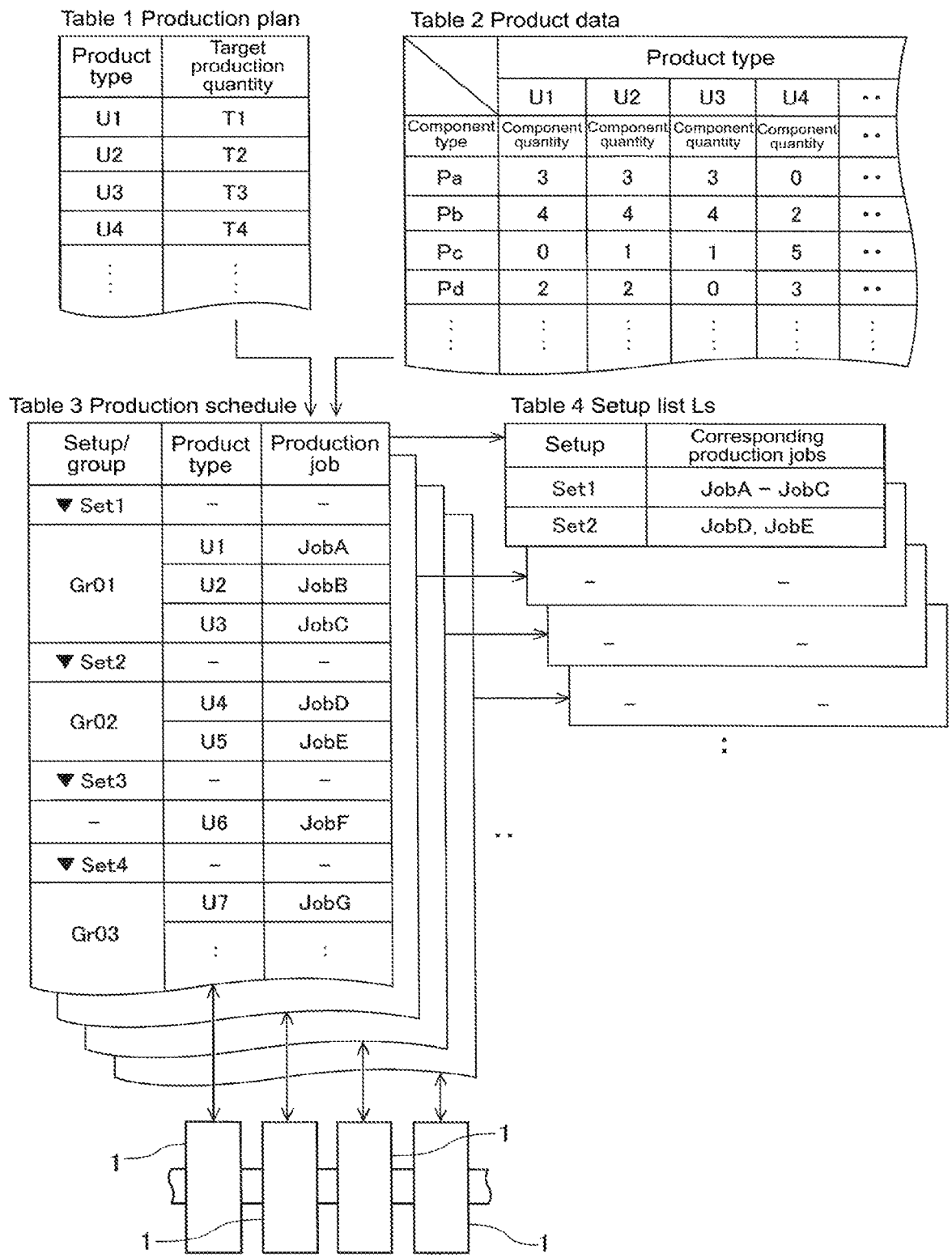
FIG. 4 shows types of data included in a production schedule.

As shown in table 3 of FIG. 4, the production schedule represents the order in which production jobs (job A, job B, job C, etc.) are performed as a production order of multiple types of board products. The production schedule is generated based on the production plan (refer to table 1 of FIG. 4) and product data (refer to table 2 of FIG. 4). In the present embodiment, the order in which the multiple production jobs (job A, job B, job C, etc.) representing the production schedule are performed is set in advance by optimization processing that optimizes such that the quantity of setups with respect to the multiple types of production jobs is reduced.

The above optimization processing, in a case in which, for example, a portion of the component types of the electronic components required between different product types are common, sets the order such that the multiple types of production jobs corresponding to these product types are performed consecutively. Accordingly, for feeders supplying common component types, setup is not required between production jobs. Further, if the total quantity of components types of the electronic components required between different product types is equal to or fewer than the quantity of slots 21 of component supply device 20, the quantity of setups can be reduced by setting feeders 23 that can supply different component types on each slot 21.

Specifically, multiple types of production jobs (job A, job B, job C, . . . ) corresponding to multiple product types (U1, U2, U3) are grouped together (Gr01). Thus, for that group (Gr01), the multiple production jobs (jobs A to C belonging to Gr01) can be performed with one setup (Set1). Further, the order in which the production jobs are performed is optimized based on factors such as the priority of production of each product type. Therefore, there are cases in which setup (Set3, Set4) is performed before or after a production job (job F) that was not grouped as above.

In the above production plan, as shown in table 1 of FIG. 4, a target production quantity (T1, T2, T3, . . . ) for each product type (U1, U2, U3, . . . ) of the board product is given. As shown in table 2 of FIG. 4, product data is data that records the component type of the electronic components required for production of a board product (Pa, Pb, Pc, Pd, . . . ), and the component quantity for each product type (U1, U2, U3, . . . ). In other words, the product data represents the component quantity consumed for each component type when producing one board product of a specified product type.

As shown in table 4 of FIG. 4, the setup list represents one or multiple production jobs selected as targets for setup at component mounter 1 among the multiple production jobs (job A, job B, job C, . . . ) included in the production schedule. The setup list, for example, in a case in which multiple jobs (job A to job E) are selected as targets for setup, or in a case in which groups (Gr01, Gr02) corresponding to these multiple jobs (job A to job E) are selected as targets for setup, shows the required setups (Set1, Set2) corresponding to the multiple production jobs (job A to job E).

Setup Support Device 70

Figure 3:
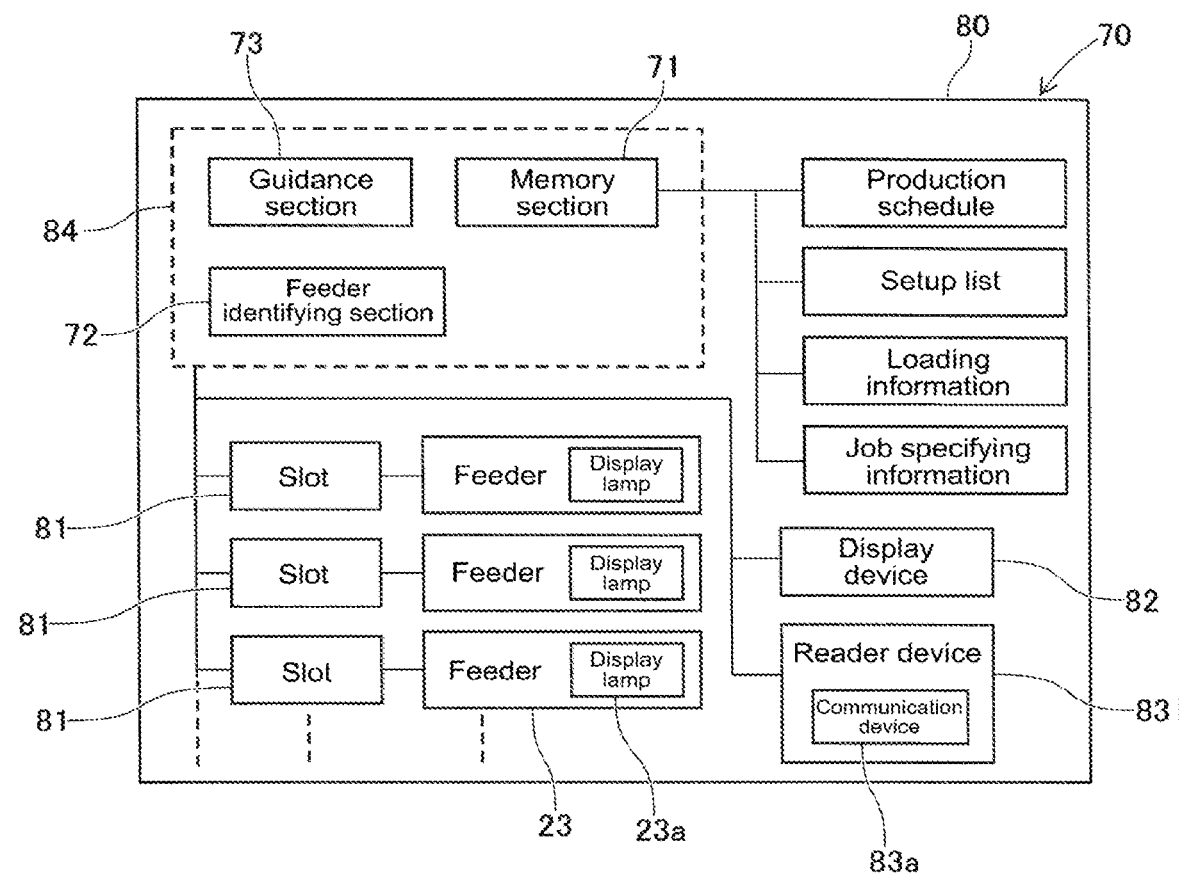
FIG. 3 is a block diagram showing the configuration of a setup support device.

Setup support device 70 is used for component mounter 1 that produces multiple types of board products (U1, U2, U3, . . . ) by executing various production jobs (job A, job B, job C, . . . ) for mounting electronic components on circuit boards 90. Setup support device 70 is connected to the multiple component mounters 1 that configure the production line and host computer 60 such that communication is possible. As shown in FIG. 3, setup support device 70 is provided with memory section 71, feeder identifying section 72, guidance section 73, and preparation cart 80.

In the present embodiment, the above memory section 71, feeder identifying section 72, and guidance section 73 are integrated in control device 84 provided in preparation cart 80. As shown in FIG. 1, preparation cart 80 is configured to be movable along the production line in the conveyance direction of circuit board 90. Exchange-use feeders 23 to be loaded on slots 21 of component supply device 20 are loaded on preparation cart 80 during setup of a production job. As shown in FIG. 3, preparation cart 80 includes multiple slots 81, display device 82, reader device 83, and control device 84.

Multiple slots 81 are configured in a similar manner to the multiple slots 21 of component supply device 20 and are for supporting exchange-use feeders 23. In the present embodiment, preparation cart 80 is configured with two levels in a vertical direction of multiple slots 81 arranged in a line in the horizontal direction. Further, the exchange-use feeders 23 set in each of the multiple slots 81 are electrically connected to preparation cart 80 to be supplied with electric power and controlled externally. Display device 82 displays various information to an operator as required. In the present embodiment, display device 82 is configured from a touchscreen and functions as an input device that receives various inputs from an operator.

Reader device 83 configures an identification device that acquires identification information of component supply device 20. In the present embodiment, reader device 83 includes communication device 83a that performs wireless communication with tag 24 and that is provided at approximately the same height as tag 24 of component supply device 20 on the surface facing the front surface of component mounter 1 of preparation cart 80. Communication device 83a of reader device 83 is configured to be able to wirelessly read the identification code provided on the component supply device 20 when preparation cart 80 gets within a specified distance of tag 24 of component supply device 20.

Specifically, for example, as preparation cart 80 is moved along the production line, as shown in FIG. 1, preparation cart 80 enters into a range (Rc1, Rc2, Rc3, . . . ) at which communication is possible for each tag 24 of the multiple component supply devices 20, and reader device 83 starts wireless communication with the tag 24, and reads the identification code memorized on the tag 24. Reader device 83, when able to communicate with multiple tags 24, for example, enables wireless communication with the tag 24 for which the signal strength of the wireless communication is strongest of each of the tags 24. In this manner, reader device 83 is configured to enable the above wireless communication when preparation cart 80 gets within a specified distance of a specified component supply device 20.

Control device 84 of preparation cart 80 is configured mainly from a CPU, various type of memory, and control circuits. Control device 84 performs recognition processing of component supply device 20 and recognition processing of exchange-use feeders 23 set on slots 81, and controls guidance for production job setup. Recognition processing of component supply device 20 is processing of acquiring identification information recorded on the identification code of component supply device 20 read by reader device 83, and processing of recognizing the closest component supply device 20 at the production line. In this manner, reader device 83 and control device 84 configure the identification device that acquires the identification information of component supply device 20.

Here, when reels with a specified component type are set on exchange-use feeders 23 loaded on preparation cart 80, processing for linking the feeder 23 and the component type is performed in advance. By this, feeder data (refer to table 1 of FIG. 5) that links reel IDs and component types is generated with a feeder ID that is unique identification information of the feeder 23. Feeder data is shared between host computer 60 and setup support device 70.

Further, when exchange-use feeder 23 is set on slot 81 of preparation cart 80, control device 84 reads the feeder ID of the set feeder 23 and recognizes the feeder 23. Control device 84 generates loading information (refer to table 2 of FIG. 5) representing multiple exchange-use feeders 23 loaded on preparation cart 80. The above loading information links the exchange-use feeder 23 (feeder ID), the set reel (reel ID), and component type (Pa, Pb, Pc, . . . ) to the slot 81 (slot ID) of preparation cart 80. Further, control device 84 updates the above loading information every time a feeder 23 is removed or inserted into a slot 81 of preparation cart 80.

Also, control device 84 of preparation cart 80, as described above, includes memory section 71, feeder identifying section 72, and guidance section 73. Memory section 71 is configured from an optical drive device such as a hard disk device, flash memory, or the like. Memory section 71 memorizes various pieces of data for controlling guidance and the like of setup by setup support device 70. Memory section 71 memorizes the production schedule (table 3 of FIG. 4), and the setup list (table 4 of FIG. 4) generated by and sent from host computer 60. Also memorized are the loading information of exchange-use feeders 23 updated or generated by control device 84 and the job specification information, which is described later.

Feeder identifying section 72 identifies the multiple feeders 23 set on component supply device 20 among the multiple feeders 23 loaded on preparation cart 80 based on the acquired identification information of a specified component supply device 20, the loading information indicating the multiple feeders 23 loaded on preparation cart 80, and the production schedule representing the order in which production jobs are performed as a production order of multiple types of board products. Specifically, feeder identifying section 72 acquires the production schedule corresponding to the identification information just acquired. Next, feeder identifying section 72 identifies feeders 23 required for the multiple production jobs included in the production schedule among the multiple exchange-use feeders 23 loaded on preparation cart 80 as feeders 23 that should be set on component supply device 20 based on the current loading information.

Here, in the present embodiment, a portion of the multiple production jobs included in the production schedule are already selected as targets for setup, and one or multiple of the selected production jobs is included in the setup list. In such a case, feeder identifying section 72 may identify the exchange-use feeders 23 required for the setup of the single or multiple production jobs included in the setup list using the setup list generated based on the production schedule.

In such identifying processing of exchange-use feeders 23, there are cases in which multiple production jobs are included in the production schedule or the setup list, and many exchange-use feeders 23 required for setup of the production jobs are loaded on preparation cart 80. In such a case, when all the feeders 23 have been identified as feeders 23 that should be set on component supply device 20, time will be required for work of loading onto component supply device 20, which means that there is a worry of setup efficiency in fact being made worse. With respect to this, feeder identifying section 72 is able to issue guidance for only a portion of the multiple production jobs included in the production schedule or setup list based on the job specifying information.

Specifically, as shown in table 3 of FIG. 5, job specifying information represents a portion or all of the multiple production jobs included in the production schedule that are targets for setup. The job specifying information shows the production jobs corresponding to the mode selected from the multiple specifying modes that include the next production mode and the group production mode. The above "next production mode" is a specifying mode for specifying only the production job to be performed next from among the multiple production jobs included in the production schedule as the target for setup.

The above "group production mode" is a specifying mode for specifying the production jobs to be performed from now from among the multiple production jobs included in the production schedule as the targets for setup. In the present embodiment, multiple production jobs specified by the group production mode are multiple production jobs grouped by optimization processing such that the production jobs can be performed using one setup. Alternatively, the multiple production jobs specified by the group production mode may be grouped based on simply a fixed quantity of jobs to be performed from now, or production jobs to be performed in a specified time period.

Further, setup support device 70 changes the specifying mode to the next production mode or the group production mode in accordance with a request from an operator. Specifically, setup support device 70 displays each of the specifying modes on display device 82, and receives a request from an operator via the display device functioning as an input device. Then, setup support device 70 changes the specifying mode in accordance with the received request.

Further, setup support device 70 may change the specifying mode to the next production mode or the group production mode based on production state of the component mounters including a degree of progress of the production schedule. Setup support device 70 may, for example, bring forward setups that should be given priority by changing the production mode to the next production mode in accordance with the production state such as the planned start time of the production job to be performed next is approaching. Feeder identifying section 72 identifies multiple feeders 23 based on the job specifying information showing the production jobs corresponding to the changed specifying mode.

Figure 6:
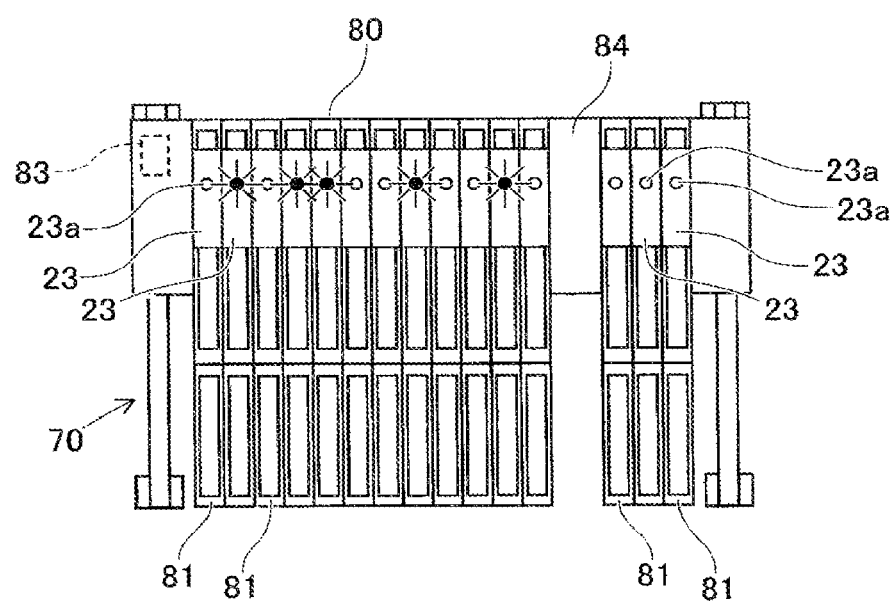
FIG. 6 shows the lighting state of display lamps of setup guidance.

Guidance section 73 issues guidance all at once for the multiple identified feeders to the operator who is to perform the setup so as to supply the multiple feeders 23 identified by feeder identifying section 72 to component supply device 20 as preparation for setting the feeders 23 on component supply device 20. Specifically, as shown in FIG. 6, guidance section 73 issues guidance all at once for the multiple feeders 23 by causing displays lamps 23a provided on feeders 23 to turn on or flash. Here, each of the display lamps 23a of the multiple identified feeders 23 turns on or flashes in the same pattern. The lamps 23a of other feeders 23 remain off. Alternatively to the above, for example, guidance section 73 may issue guidance all at once for multiple feeders 23 by causing display lamps provided on each slot holding the feeders 23 on preparation cart 80 to turn on or flash.

Here, to perform setup to enable production jobs to be performed, it is necessary to set the identified feeders 23 in the identified slots 21 of component supply device 20. That is, an operator, during a normal setup, performs work of setting feeders 23 loaded on preparation cart 80 on the identified slots 21 for the specified quantity of feeders 23, then moves to another nearby component supply device 20 at the production line and repeats a similar setup.

With respect to this, guidance section 73 issues guidance all at once to supply the multiple identified feeders 23 to component supply device 20 as preparation (first step) of setting the feeders 23 on slots 21. By this, an operator is able to recognize all at once which are the multiple feeders 23 to be supplied to the component supply device 20 closest to preparation cart 80 from the multiple feeders 23 loaded on preparation cart 80. As a method of supplying to component supply device 20, exchange-use feeders 23 may be provisionally inserted (provisionally set) into slots 21, or in a case in which there is a dedicated temporary loading stand for component supply device 20, the exchange-use feeders 23 may be loaded on the temporary loading stand.

By this, the operator, during setup with respect to component mounter 1, performs work by dividing the work into a process for supplying the multiple exchange-use feeders 23 all at once to component supply device 20, and a process of setting each of the multiple feeders in the identified slots 21. Thus, compared to performing setup by accurately setting one by one into slots 21, setup efficiency is improved, and work is easy to divide between multiple operators.

Further, by repeating the process of supplying multiple exchange-use feeders 23 to component supply device 20, for example, compared to a conventional case in which the actions of completing setup from the upstream side of the production line and then moving preparation cart 80 are repeated, work for each process is performed all at once, thus improving efficiency. By this, setup support device 70 improves overall setup efficiency.

Setup Guidance Processing

Setup guidance processing for production jobs by setup support device 70 will be described with reference to FIGS. 4 to 7. Here, the above setup is processing for replenishment of feeders 23 that are exchangeably set on component mounter 1. Further, it is assumed that exchange-use feeders 23 used to perform multiple production jobs (jobs A to G) of the production schedule are loaded on preparation cart 80.

The component types corresponding to the reels that are set are linked in advance to each of the exchange-use feeders 23. Host computer 60 and setup support device 70 share the feeder data (table 1 of FIG. 5) generated based on the above link and the loading information (table 2 of FIG. 5) indicating the multiple feeders 23 loaded on preparation cart 80. Note that, as shown in FIG. 4, the above production schedule is generated for each of the multiple component mounters 1 in the production line based on the production plan and the product data, and is memorized on memory section 71 of setup support device 70.

Also, in the present embodiment, to reduce the time required to perform multiple production jobs, mounting processing of the multiple production jobs is optimized. As a result, to reduce the movement distance of mounting head 33 during mounting processing, the component types supplied at each of the multiple slots 21 on component supply device 20 are set in advance. In other words, for feeders 23 linked to the component type of the reel set on the component feeder 23, it is set in advance to which slots 21 on component supply device 20 the feeders 23 are set.

Also, host computer 60 generates and memorizes on memory section 71 of setup support device 70 setup list Ls based on the two groups (Gr01, Gr02) selected as the targets for setup from the production schedule. As shown in table 4 of FIG. 4, multiple production jobs (jobs A to E) belonging to the two groups (Gr01, Gr02) are included in setup list Ls. The generated setup list Ls is sent to setup support device 70 via the network and memorized on memory section 71.

Figure 7:
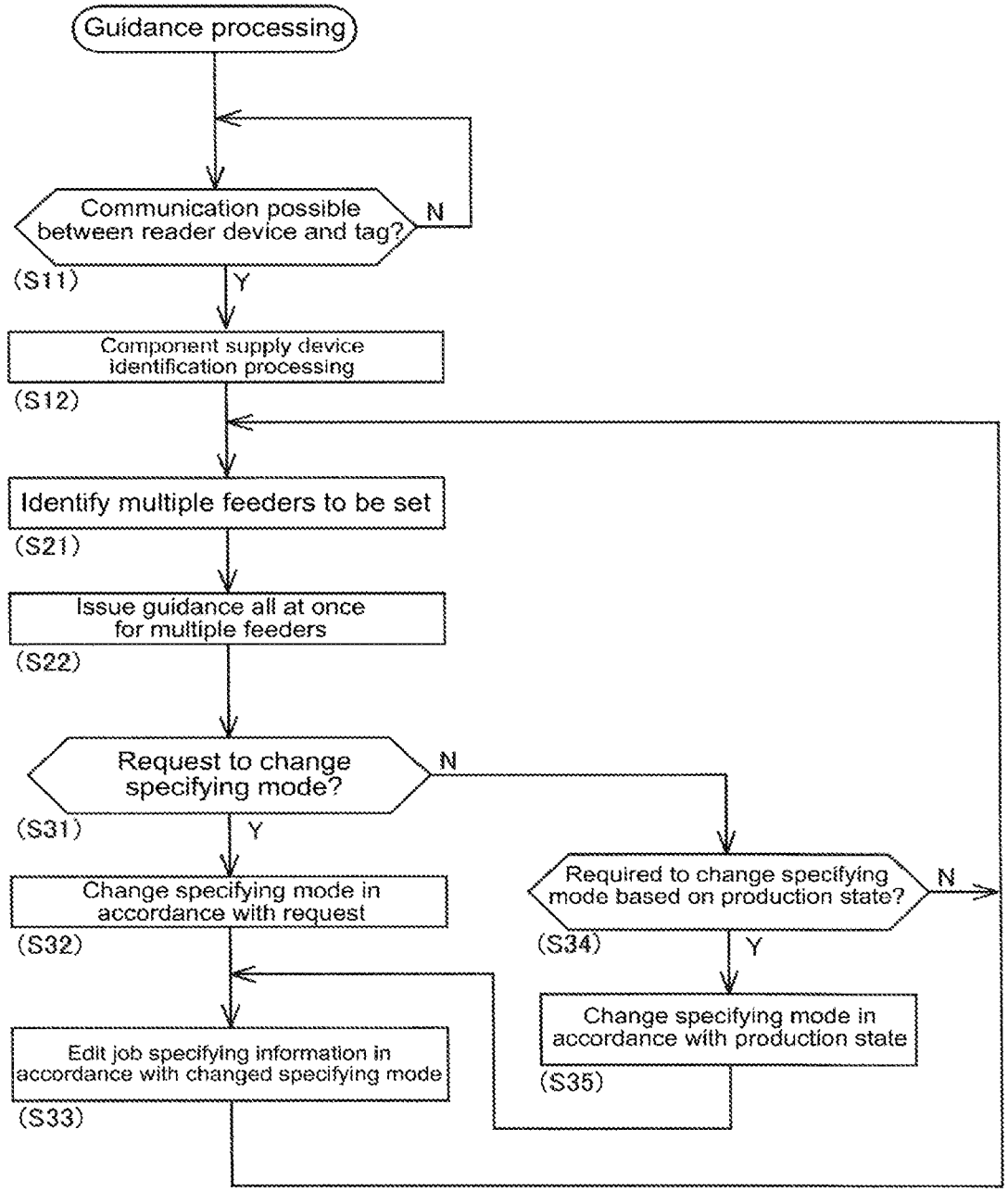
FIG. 7 is a flowchart showing setup guidance processing.

Setup support device 70, for example, when receiving a request for setup guidance from an operator via display device 82, as shown in FIG. 7, starts setup guidance processing. Setup support device 70 determines whether reader device 83 of preparation cart 80 can communicate with any of the tags 24 of component supply device 20 (step 11 [hereinafter, "step" is abbreviated to "S"]). If reader device 83 cannot communicate with a tag 24 (S11: no), setup support device 70 performs a determination as to whether communication is possible periodically (S11).

Then, for example, an operator moves preparation cart 80 within a range in which reader 83 can communicate with one of the tags 24 of component supply device 20. Thus, it is determined that reader device 83 can communicate with a tag 24 (S11: yes), and setup support device 70 performs recognition processing of component supply device 20 (S12). Here, preparation cart 80 is moved in front of a first component mounter 1 such that reader device 83 is within a range (Rc1) in which communication is possible with tag 24.

In recognition processing of component supply device 20 (S12), first, reader device 83 performs wireless communication with the tag 24 to read the identification code recorded on the tag 24. Next, control device 84 of preparation cart 80 acquires the identification code read by reader device 83 and acquires the identification information recorded on the identification code. Thus, setup support device 70 recognizes the component supply device 20. According to the above configuration, by an operator moving preparation cart 80 it is possible to automatically recognize for which of multiple component mounters 1 in the production line setup of the component supply device 20 is to be performed.

Next, feeder identifying section 72 identifies the multiple feeders 23 set on component supply device 20 among the multiple feeders 23 loaded on preparation cart 80 (S21). Feeder identifying section 72 acquires the setup list Ls or production schedule corresponding to the first component mounter 1 based on the identification information acquired in S12. Here, because setup list Ls is generated in advance based on the production schedule, feeder identifying section 72 acquires setup list Ls.

Feeder identifying section 72 identifies the multiple feeders 23 set on the multiple slots 21 of component supply device 20 based on the multiple production jobs (jobs A to E) included in the setup list Is and the loading information memorized on memory section 71. In the present embodiment, feeder identifying section 72 extracts the feeder IDs of the feeders 23 required for the setup of the multiple production jobs (jobs A to E) based on the optimization information representing which feeders 23 to set to which of the multiple slots 21. Then, feeder identifying section 72 identifies the multiple feeders 23 by referencing the feeder IDs with the loading information.

Continuing, guidance section 73 issues guidance all at once for the multiple feeders 23 to the operator who is to perform supply of the multiple feeders 23 identified in S21 to component supply device 20 (S22). Specifically, display lamps 23a of the multiple identified feeders 23 are caused to turn on or flash. By this, an operator is able to recognize all at once the multiple feeders 23 to be supplied to the component supply device 20 closest to preparation cart 80. Display lamps 23a of exchange-use feeders 23 turn off when the feeder 23 is removed from slot 81 of preparation cart 80 by the operator.

As described above, in a state with guidance device 73 guiding the setup, setup support device 70 determines whether there is a request to change the specifying mode by the operator (S31). For example, when there is a request by an operator via display device 82 to change the specifying mode (S31: Yes), setup support device 70 changes the specifying mode to the next production mode or the group production mode in accordance with the request of the operator (S32). Then, setup support device 70 edits the job specifying information in accordance with the changed specifying mode (S33).

Specifically, for example, when the specifying mode is changed from an initial setting of the group production mode to the next production mode, the job specifying information is edited such that the target for setup is only the production job to be performed next (job A) from among the multiple production jobs (jobs A to E) included in the setup list. By this, the job specifying information is edited from the right column in table 3 of FIG. 5 to the left column. Further, if the specifying mode is changed from the next production mode to the group production mode, or if the specifying mode is canceled and there is a request to specify one or multiple production jobs individually, setup support device 70 edits the job specifying information in accordance with the request.

Also, if there is no request to change the specifying mode by an operator (S31: no), setup support device 70 determines whether it is necessary to change the specifying mode to the next production mode or the group production mode based on the production state of the component mounters including a degree of progress of the production schedule (S34). Setup support device 70, in such a case, and if the current specifying mode is different to the specifying mode to which the mode should be changed, determines that it is necessary to change the specifying mode (S34: yes).

Setup support device 70, for example, in a case in which the production state is one in which the planned start time of the production job to be performed next is approaching, changes the specifying mode to the next production mode to give priority to setup of the next production job (S35). Alternatively, setup support device 70, for example, in a case in which exchange-use feeders 23 are additionally loaded to preparation cart 80 and setup of multiple grouped production jobs becomes possible, changes the specifying mode to the group production mode to improve the efficiency of the process of supplying exchange-use feeders 23 to component supply device 20 (S35). Then, setup support device 70 edits the job specifying information in accordance with the changed specifying mode (S33).

As described above, when the job specifying information has been edited (S33), feeder identifying section 72 re-identifies the multiple feeders 23 based on the job specifying information representing the production jobs corresponding to the changed specifying mode. Further, guidance section 73 issues guidance all at once for the multiple feeders 23 to the operator who is to perform supply of the multiple feeders 23 identified again in S21 to component supply device 20 (S22). Thus, the quantity of feeders 23 for which the display lamps 23a are turned on or flashing increases or decreases based on the guidance.

Further, in a case in which setup support device 70 determines that it is not necessary to change the specifying mode (S34: no), setup support device 70 determines whether there was a request by an operator to change the specifying mode (S31), and repeats the determination of whether it is necessary to change the specifying mode to the next production mode or the group production mode based on changing production state (S34). Setup support device 70, when all the exchange-use feeders 23 for which guidance was issued have been supplied to component supply device 20 and preparation cart 80 is moved such that reader device 83 can communicate with a different tag 24, ends setup guidance processing for the target component supply device 20 of the first component mounter 1.

Effects According to Configuration of Embodiments

Setup support device 70 supports setup of component mounter 1. Component mounter 1 produces multiple types of board products by performing various multiple production jobs by picking up electronic components supplied by multiple feeders 23 set on component supply device 20 and mounting the electronic components on circuit boards 90. Setup support device 70 is provided with: preparation cart 80 on which are loaded multiple of the feeders 23 used to perform the multiple production jobs; an identification device (reader device 83, control device 84) configured to acquire identification information of the component supply device 20; and feeder identifying section 72 configured to identify multiple of the feeders 23 to be set on the component supply device 20 among the multiple feeders 23 loaded on the preparation cart 80, based on the identification information, loading information that indicates the multiple feeders 23 loaded on the preparation cart 80, and a production schedule that indicates an order in which to perform the production jobs that is a production order of the multiple types of board products. Preparation cart 80 includes guidance section 73 configured to issue guidance all at once for the identified multiple feeders 23 to an operator performing the setup so as to supply the identified multiple feeders 23 to component supply device 20 as preparation for setting the identified multiple feeders 23 on component supply device 20.

According to such a configuration, an operator can easily identify feeders 23 to supply to component supply device 20 among the multiple feeders 23 loaded on preparation cart 80 according to the guidance. Thus, an operator can supply to component supply device 20 as preparation for setting to a slot. Further, setup is divided into a process of collectively supplying multiple feeders 23, and a process of reliably setting the multiple feeders 23. As a result, because processes are each performed efficiently, it is possible to perform setup of component mounter 1 overall efficiently and reliably.

Also, feeder identifying section 72 identifies the multiple feeders 23 based on job specifying information representing a portion or all of the multiple production jobs included in the production schedule as the targets for setup.

According to such a configuration, even if the multiple feeders 23 to be used on the multiple types of production jobs are loaded on preparation cart 80 for performing setup, the target for guidance for supply is only for the multiple feeders to be used in the production job in the job specifying information. Then, the remaining feeders 23 are supplied to component supply device 20 after the job specifying information has been updated. In this manner, not all the feeders 23 loaded on preparation cart 80 are taken as the target, but guidance is issued for a portion of the feeders 23 to be supplied in accordance with requirements, and it is possible to efficiently supply multiple feeders 23 all at once.

Further, the job specifying information indicates the production jobs corresponding to one of a mode selected from multiple specifying modes that include: a next production mode that specifies only the production job that is to be performed next among the multiple production jobs included in the production schedule as a target for the setup, and a group production mode that specifies multiple production jobs to be performed next or later among the multiple production jobs included in the production schedule as targets for the setup.

According to such a configuration, when the job specifying mode is the next production mode, setup support device 70 issues guidance to supply only the feeders 23 required for the production job to be performed next to component supply device 20. Thus, because supplying feeders 23 to be used for production jobs planned to be performed subsequently is put off until later, with only the minimum setup required to be able to perform the next production job being performed, the time required for setup is reduced. Also, if the job specifying information is the group production mode, setup support device 70 issues guidance such that enough feeders 23 are supplied all at once to component supply device 20 to be able to perform several production jobs. By this, because supply of feeders 23 that are loaded on preparation cart 80 but for which there is ample time before being used for a production job is put off until later, and setup is performed to enable several production jobs requested by an operator or the like to be performed, setup can be performed efficiently.

Also, the order in which the multiple production jobs representing the production schedule are performed is set in advance by optimization processing that optimizes such that the quantity of setups with respect to the multiple types of production jobs is reduced. Multiple production jobs specified by the group production mode are multiple production jobs grouped by optimization processing such that the production jobs can be performed using one setup.

The multiple production jobs indicated in the production schedule are optimized such that the overall production finishes as early as possible including the time required for setup of each production job. In this optimization processing, trial and error of partial shared setups is performed considering the component types and component quantities used in each production job. As a result, optimization is performed such that the quantity of setups with respect to the quantity of types of production jobs is reduced, and the production order of the production jobs is set in advance. Further, setup support device 70 takes the multiple jobs grouped by the optimization processing such that they can be performed using one setup as the multiple production jobs specified by the group production mode. Thus, it is possible for an operator or the like to reflect the results of optimization processing in the job specifying information and to specify the targets for setup and the production jobs all at once.

According to such a configuration, setup support device 70 receives an instruction from an operator to switch modes, and changes the job specifying information. By this, compared to a conventional configuration in which the order in which the production jobs are performed is set and guidance is issued to an operator for a fixed setup target, the targets for setup can be changed in accordance with the wishes of the operator. Thus, for example, it is possible to put off until later setups that are not required for the next production job, and it is possible to effectively divide human resources such as operators.

Further, setup support device 70 may change the specifying mode to the next production mode or the group production mode based on production state of the component mounters including a degree of progress of the production schedule. Feeder identifying section 72 identifies multiple feeders based on the job specifying information showing the production jobs corresponding to the changed specifying mode.

According to such a configuration, setup support device 70 automatically changes the job specifying information based on the production state of component mounters 1 including a degree of progress of the production schedule. By this, compared to a conventional configuration in which the order in which the production jobs are performed is set and guidance is issued to an operator for a fixed setup target, the targets for setup can be changed in accordance with a production state such as that the start time of the production job to be performed next is approaching. Thus, for example, it is possible to put off until later setups that are not required for the next production job, and it is possible to effectively divide human resources such as operators to perform setups that should be given priority.

Setup support device 70 supports setup of multiple component mounters 1 that configure a production line that produces board products. Component mounters 1, during production of the board products, perform a production job by picking up electronic components supplied by multiple feeders 23 set on component supply device 20 and mounting the electronic components on circuit boards 90. Setup support device 70 includes: preparation cart 80 on which are loaded multiple of the feeders 23 used to perform the multiple production jobs at each of the multiple component mounters 1; an identification device (reader device 83, control device 84) configured to acquire identification information of component supply devices 20 of the multiple component mounters 1; and feeder identifying section 72 configured to identify multiple of the feeders 23 to be set on component supply device 20 among the multiple feeders 23 loaded on preparation cart 80, based on the identification information, and loading information that indicates the multiple feeders 23 loaded on preparation cart 80. Preparation cart 80 includes guidance section 73 configured to issue guidance all at once for the identified multiple feeders 23 to an operator performing the setup so as to supply the identified multiple feeders 23 to component supply device 20 as preparation for setting the identified multiple feeders 23 on component supply device 20.

According to such a configuration, an operator can easily identify feeders 23 to supply to component supply device 20 among the multiple feeders 23 loaded on preparation cart 80 according to the guidance. Thus, an operator can supply to component supply device 20 as preparation for setting to a slot. Further, setup is divided into a process of collectively supplying multiple feeders 23, and a process of reliably setting the multiple feeders 23. As a result, because processes are each performed efficiently, it is possible to perform setup of component mounter 1 overall efficiently and reliably.

Further, guidance section 73 of preparation cart 80 issues guidance all at once for multiple feeders 23 by causing display lamps 23a provided on each slot holding the feeders 23 on preparation cart 80 or display lamps 23a provided on the feeders 23 to turn on or flash.

According to such a configuration, it is possible to prompt an operator to supply multiple feeders 23 all at once to component supply device 20 by the guidance using display lamps 23a. If display lamps 23a are provided on feeders 23, by also using display lamps 23a of feeders 23 for setup, there is no need to provide a new display section of preparation cart 80, and guidance to supply to component supply device 20 for the target setup can be issued reliably along with another display means.

Also, the identification device (reader device 83, control device 84) includes reader device 83 that reads the identification code provided on component supply device 20 and acquires identification information recorded on the identification code. According to such a configuration, setup support device 70 acquires the identification information by reading the identification code of component supply device 20 using reader device 83. According to such a configuration, recognition processing is performed by an operator performing reading work or by automatic reading by reader device 83 in accordance with the approaching of preparation cart 80. By this, an operator can reliably identify the component supply device 20 for which setup is planned with setup support device 70.

Also, reader device 83 includes communication device 83a that is able to read an identification code via wireless communication when preparation cart 80 gets within a specified distance of component supply device 20. According to such a configuration, reader device 83 that configures an identification device reads an identification code via wireless communication when preparation cart 80 gets within a specified distance of a specified component supply device 20. By this, setup support device 70 is able to (automatically) read identification information of the component supply device 20 close to preparation cart 80 without an operator performing reading work of the identification code. Thus, setup work is simplified and the time required for setup is reduced.

Alternative Embodiments

Configuration of Production Line and Setup Guidance

In an embodiment above, setup support device 70 issues consecutive setup guidance to an operator for each component supply device 20 of the multiple component mounters 1 that configure the production line. However, setup support device 70 may be used in a case in which the production line is configured from a single component mounter 1, a screen printer, an inspection machine, and a reflow oven.

That is, setup support device 70 may issue guidance all at once for multiple feeders 23 to be used in a single or multiple production jobs and identified by feeder identifying section 72 in a case in which the multiple feeders 23 to be used in multiple production jobs to be performed at a single component mounter 1 are loaded on preparation cart 80. The same effects are achieved with such a configuration as with the configuration of the first embodiment. Also, in a case in which the production line is configured from multiple component mounters 1, setup support device 70 may be used such that each component mounter 1 only performs one type of production job. That is, setup support device 70, when preparation cart 80 loaded with multiple feeders 23 to be used in production jobs to be performed by each of the multiple component mounters 1 is moved near to a specified component supply device 20, for example, may automatically identify the component supply device 20 as described in an embodiment above, and issue guidance all at once for the multiple feeders 23 corresponding to the production job to be performed by the component mounter 1 on which the component supply device 20 is set. The same effects are achieved with such a configuration as with the configuration of the first embodiment.

Feeder Identifying Processing

In an embodiment above, feeder identifying section 72 is configured to identify multiple feeders 23 based on a specifying mode that specifies one or multiple production jobs as targets for setup. Also, the above specifying mode may be the next production mode or the group production mode. However, the specifying mode may include various specifying modes. Specifically, feeder identifying section 72 may be configured to identify multiple feeders 23 based on a specifying mode that specifies a fixed quantity of production jobs, or a specifying mode that specifies production jobs such that the quantity of exchange-use feeders 23 supplied to component supply device 20 is equal to or less than a specified quantity.

Further, in an embodiment above, feeder identifying section 72 identifies multiple feeders 23 based on the job specifying information showing the production jobs corresponding to the specifying mode selected from the multiple specifying modes. However, feeder identifying section 72 may be configured to identify the multiple feeders 23 without using the job specifying information. Specifically, feeder identifying section 72, for example, may issue guidance all at once for all of the multiple feeders 23 loaded on preparation cart 80 that are to be used in production jobs to be performed by the component mounter 1 on which the identified component supply device 20 is set.

Further, in an embodiment above, setup support device 70 is configured to switch the specifying mode in accordance with a request from an operator or a production state. However, setup support device 70 may be configured with certain restrictions on switching the specifying mode in accordance with a request from an operator or a production state. This is because one may consider, for example, cases in which, rather than giving priority to setup of a production job to be performed next, overall productivity will improve by giving priority to setup of multiple production jobs performed according to the initial production schedule.

Identification Device

In an embodiment above, the identification device is configured from reader device 83 and control device 84. However, the identification device may take many forms so long as it is able to acquire the identification information of component supply device 20. Specifically, in a case of an identification code being provided on component supply device 20, a camera that acquires image data or a hand scanner may be used as a reader device to read the identification code, and control device 84 or a separate device may acquire the identification information recorded on the identification code. Also, the identification device may be an input device that receives direct input of the identification information from an operator.

Application of Setup Support Device

In an embodiment above, each section of setup support device 70 (memory section 71, feeder identifying section 72, and guidance section 73) is integrated in control device 84 of preparation cart 80. However, a portion or the entirety of each section of setup support device 70 may be integrated into component mounter 1 or host computer 60. The same effects are achieved with such a configuration as with the configuration of the first embodiment.

REFERENCE SIGNS LIST

1: component mounter;
10: board conveyance device;
20: component supply device;
21: slot;
23: feeder
24: tag;
30: component transfer device;
31: head driving device;
32: moving body;
33: mounting head;
34: suction nozzle;
41: component camera;
42: board camera;
50: control device;
60: host computer;
70: setup support device;
71: memory section;
72: feeder identifying section;
73: guidance section;
80: preparation cart;
81: slot;
82: display device;
83: reader device (identification device);
83a: communication device;
84: control device (identification device);
90: circuit board

The invention claimed is:

1. A setup support device for supporting setup of a component mounter configured to produce multiple types of board products by performing various multiple production jobs by picking up electronic components supplied by multiple feeders set on a component supply device and mounting the electronic components on circuit boards, the setup support device comprising:
a preparation cart on which are loaded multiple of the feeders used to perform the multiple production jobs;
an identification device configured to acquire identification information of the component supply device; and
a feeder identifying section configured to identify multiple of the feeders to be set on the component supply device among the multiple feeders loaded on the preparation cart, based on the identification information, loading information that indicates the multiple feeders loaded on the preparation cart, and a production schedule that indicates an order in which to perform the production jobs that is a production order of the multiple types of board products,
wherein
the preparation cart includes a guidance section configured to issue guidance all at once for the identified multiple feeders to an operator performing the setup so as to supply the identified multiple feeders to the component supply device as preparation for setting the identified multiple feeders on the component supply device.

2. The setup support device according to claim 1, wherein the feeder identifying section is configured to identify the multiple feeders based on job specifying information that indicates all or a portion of the multiple production jobs included in the production schedule as a target for the setup.

3. The setup support device according to claim 2, wherein the job specifying information indicates the production jobs corresponding to one of a mode selected from multiple specifying modes that include
a next production mode that specifies only the production job that is to be performed next among the multiple production jobs included in the production schedule as a target for the setup, and
a group production mode that specifies multiple production jobs to be performed next or later among the multiple production jobs included in the production schedule as targets for the setup.

4. The setup support device according to claim 3, wherein an order in which the multiple production jobs indicated by the production schedule is performed is set in advance by optimization processing that optimizes such that a quantity of setups for multiple types of the production jobs is reduced, and
the multiple production jobs specified by the group production mode are multiple production jobs grouped such that the production jobs can be executed using a single setup from the optimization processing.

5. The setup support device according to claim 3, wherein the setup support device is configured to change the specifying mode to the next production mode or the group production mode in accordance with a request from an operator, and
the feeder identifying section is configured to identify the multiple feeders based on the job specifying information indicating the production jobs in accordance with the changed specifying mode.

6. The setup support device according to claim 3, wherein the setup support device is configured to change the specifying mode to the next production mode or the group production mode based on a production state of the component mounter including a degree of progress of the production schedule, and
the feeder identifying section is configured to identify the multiple feeders based on the job specifying information indicating the production jobs in accordance with the changed specifying mode.

7. The setup support device according to claim 1, wherein the guidance section of the preparation cart is configured to issue guidance all at once for the multiple feeders by causing a display lamp provided on each slot that holds a feeder on the preparation cart or a display lamp provided on the feeder to turn on or flash.

8. The setup support device according to claim 1, wherein the identification device includes a reader device configured to read an identification code provided on the component supply device and acquire the identification information that is recorded in the identification code.

9. The setup support device according to claim 1, wherein the reader device includes a communication device configured to read the identification code via wireless communication when the preparation cart is brought within a specified distance of the component supply device.

10. A setup support device for supporting setup of multiple component mounters that configure a production line that produces board products, the component mounters being configured to perform multiple production jobs by picking up electronic components supplied by multiple feeders set on a component supply device and mounting the electronic components on circuit boards, the setup support device comprising:
- a preparation cart on which are loaded multiple of the feeders used to perform the multiple production jobs;
- an identification device configured to acquire identification information of the component supply device; and
- a feeder identifying section configured to identify multiple of the feeders to be set on the component supply device among the multiple feeders loaded on the preparation cart, based on the identification information, and loading information that indicates the multiple feeders loaded on the preparation cart, wherein the preparation cart includes a guidance section configured to issue guidance all at once for the identified multiple feeders to an operator performing the setup so as to supply the identified multiple feeders to the component supply device as preparation for setting the identified multiple feeders on the component supply device.

* * * * *